Jan. 4, 1966 K. HINRICHS 3,228,023

DIGITALLY CONTROLLED AMPLIFIER

Filed June 14, 1962 2 Sheets-Sheet 1

*INVENTOR.*

KARL HINRICHS

*BY* Samuel B. Stone

ATTORNEY

INVENTOR.
KARL HINRICHS
BY T E Kristofferson
ATTORNEY

United States Patent Office 3,228,023

Patented Jan. 4, 1966

3,228,023
DIGITALLY CONTROLLED AMPLIFIER

Karl Hinrichs, Anaheim, Calif., assignor to Beckman Instruments, Inc., a corporation of California Filed June 14, 1962, Ser. No. 202,488
8 Claims. (Cl. 340—347)

Figure 1:
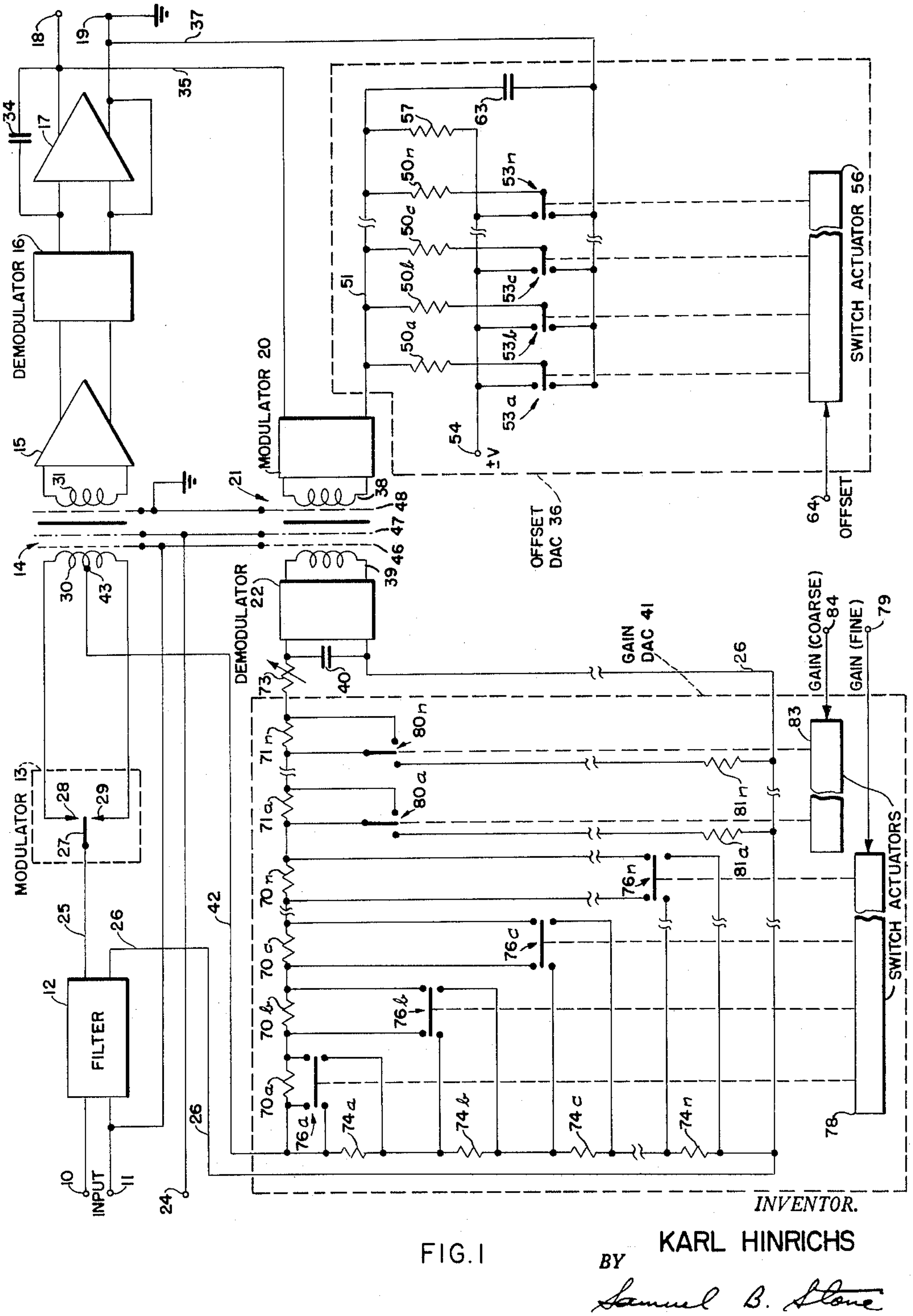

This invention relates to an amplifier and more particularly to an amplifier in which gain and offset may be digitally controlled.

Frequently it is necessary to utilize amplifiers for increasing the magnitude of data signals. An exemplary application is in the field of data handling and data processing wherein it may be necessary to sample output signals from a plurality of transducers situated in diverse locations. The transducer signals generally are low-level signals and it is necessary to amplify the signals before they are applied to data handling equipment. The signals from different transducers may require different degrees of amplification, and the offset voltages of the transducers, power supplies, calibrators, components, etc. associated therewith may vary from channel to channel. It is desirable to remotely control the gain of the amplifiers associated with the transducers, and to remotely control the offset voltages generated for each channel. For high accuracy, linearity and high common mode rejection, precision amplifiers having a high input impedance, conductive and electrostatic isolation of the input of the amplifier from the output thereof, and low output impedance are needed. Any apparatus for controlling gain or offset must not affect the input impedance, gain accuracy, the output impedance, or the isolation of the amplifier.

In the past it has been conventional to employ a main amplifier plus a second amplifier for providing remote control of gain and offset. One method is to employ the second amplifier at the output of the main amplifier, but this arrangement frequently causes saturation of the main amplifier or causes the main amplifier to operate in its low amplitude and low accuracy region. Another arrangement is to utilize a "signal conditioner" before the main amplifier. The "signal conditioner" requires an extra variable gain floating amplifier since the input to the main amplifier is floating with respect to the output thereof. Additionally, a floating power supply is required for the control of offset. Control communication from a data system to such "floating" devices necessarily involves isolation and switching of controls which may readily degrade the accuracy and isolation of the signal circuits.

Accordingly, the present invention provides a single amplifier in which gain and offset may be digitally controlled while maintaining high input impedance, low output impedance and conductive and electrostatic isolation of the input from the output thereof.

Another feature of the present invention is the provision of an amplifier having digitally operable impedance networks connected in the feedback circuit thereof and which may be remotely controlled by digital signals to control gain and offset.

A further feature of the present invention is the provision of a highly accurate amplifier having virtually complete conductive and electrostatic isolation between the input and the output of the amplifier and including a digitally controlled impedance network in the feedback circuit of the amplifier for controlling offset.

An additional feature of the present invention is the provision of a highly accurate amplifier having virtually complete conductive and electrostatic isolation between the input and the output of the amplifier and including a digitally controlled impedance network in the feedback circuit of the amplifier for controlling gain.

A further feature of the present invention is the provision is a highly accurate amplifier having virtually complete conductive and electrostatic isolation between the input and the output thereof, and including first and second digitally controlled impedance networks in the feedback circuit of the amplifier for respectively controlling offset and gain.

An additional feature of the present invention is the provision of a digitally controlled potentiometer having a constant input impedance.

A further feature of the present invention is the provision of a digitally controlled potentiometer with compressed coding having a constant input impedance and which provides fine and coarse control of attenuation of a signal applied thereto.

In accordance with the teachings of the present invention, an amplifier is provided which includes a digital-to-analog converter (DAC) connected in the feedback circuit of the amplifier. This DAC is utilized to control offset, and by digital control subtracts from or adds to the signal fed back without requiring an additional amplifier and without damaging the output impedance of the over-all amplifier. A digitally controlled potentiometer (DCP) is connected in the feedback circuit of the amplifier for controlling the over-all gain thereof. This DCP may be digitally controlled to vary the attenuation of the feedback signal, thereby controlling the over-all gain of the amplifier.

The digitally controlled potentiometer includes a plurality of impedances connected in series with the feedback signal and a plurality of impedances connected in parallel with the feedback signal to form a potentiometer. Switches are connected with the resistances to control the attenuation of the feedback signal to thereby control the gain of the amplifier, while the input impedance of the potentiometer remains constant. Certain of the resistances provide fine control of attenuation and certain of the resistances provide coarse control of attenuation.

Figure 3:
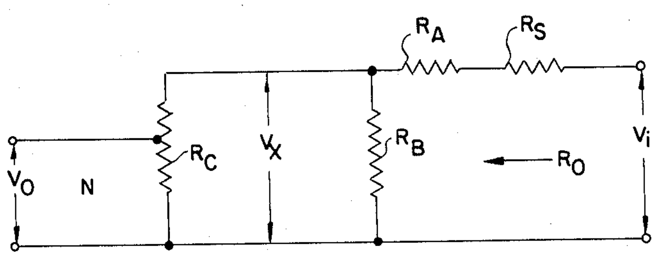
Figure 2:
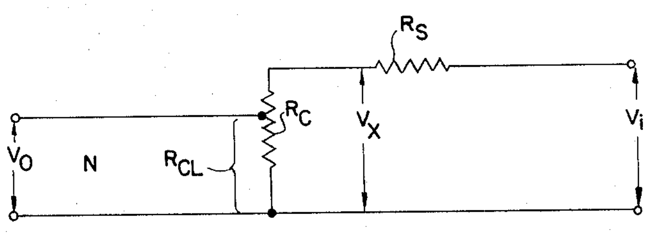

Other features and objects of the invention will be better understood from a consideration of the following detailed description when read in conjunction with the attached drawings in which FIG. 1 illustrates an amplifier having digital control for gain and offset constructed in accordance with the teachings of the present invention;

FIG. 2 is an equivalent circuit diagram of the digitally controlled potentiometer of FIG. 1 without the addition of the series and parallel resistances; and FIG. 3 is an equivalent circuit diagram of the digitally controlled potentiometer of FIG. 1 with the additional series and parallel resistances.

Referring now to the drawing, an amplifier including an offset digital-to-analog converter (DAC) and a gain digitally controlled potentiometer connected with the feedback circuit is illustrated. Although the basic amplifier may take many forms, it may be of the nature described in copending U.S. Patent 3,130,373, entitled "Potential Difference Transfer Device," filed April 27, 1959, and assigned to the assignee of the present application. This copending patent describes an ultralinear high accuracy amplifier for signals having a frequency range from direct current to a low alternating current frequency. Considering only the basic amplifier for the moment, it includes input terminals 10 and 11 connected with a filter 12. The filter 12 is connected through a modulator 13 and transformer 14 to a carrier amplifier 15. The output of the carrier amplifier 15 is connected through a demodulator 16 to a subamplifier 17. The output of the subamplifier 17 is connected to output terminals 18 and 19. A feedback circuit for the basic amplifier includes a modulator 20 connected with the output of the subamplifier 17. The modulator 20 is connected through a transformer 21 to a demodulator 22. The demodulator 22 conventionally is connected to a potential divider which in turn is connected back to the input circuit of the over-all amplifier to provide a feedback signal in series opposition with the output of the filter 12.

Considering the amplifier shown in FIG. 1 in greater detail, a transducer (not shown), which may be a thermocouple, a strain gauge, a thermistor or the like, is connected to the input terminals 10 and 11. An input terminal 24 normally is connected to the shield of the transducer, the signal terminals of which are connected to the input terminals 10 and 11. Signals from the transducer are applied through the filter 12 to output leads 25 and 26 thereof. The modulator 13 includes a vibrating contact arm 27 and fixed contacts 28 and 29. A shielded winding (not shown) is utilized to control the vibratory movement of the arm 27. The output lead 25 of the filter 12 is connected to the contact arm 27 of the modulator 13. The stationary contacts 28 and 29 are connected to a primary winding 30 of the transformer 14.

A secondary winding 31 on the transformer 14 is connected to the input of the carrier amplifier 15. The output of the carrier amplifier 15 is connected through the demodulator 16 to the amplifier 17. The demodulator 16 is synchronized with the modulator 13. The amplifier 17 is preferably of the operational type having a capacitor 34 coupled between its input and output, and this amplifier functions as an integrator.

The output of the amplifier 17 is connected to the output terminals 18 and 19. The terminal 19 is grounded. The terminal 18 is connected through a line 35 to the input of the modulator 20 in the feedback circuit. An offset DAC shown within the dashed line box 36 also is connected to the input of the modulator 20. A line 37 is connected from the terminal 19 (ground) to the DAC 36. The feedback lines 35 and 37 connected to the output of the amplifier 17 may be remotely sensed as is well known in the field of high accuracy data systems where the over-all amplifier is distant from a central voltage point. The offset DAC 36 adds to or subtracts from the feedback voltage applied to the modulator 20. This addition or subtraction is accomplished by digital control of the offset DAC 36.

The output of the modulator 20 is connected to a primary winding 38 of the feedback transformer 21. A secondary winding 39 of the transformer 21 is connected to the demodulator 22. A capacitor 40 and a gain digitally controlled potentiometer (DCP) 41 are connected across the output of the demodulator 22. The gain DCP 41 digitally controls the attenuation of the feedback signal and thus controls the gain of the over-all amplifier.

The output of the gain DCP 41 is connected through the lead 26 to the filter 12 and through a lead 42 to a center tap 43 on the primary winding 30 of the transformer 14. The attenuated feedback signal across the output of the gain DCP 41 opposes the filtered transducer signal, and the combination of the two is called a difference on error signal. As is always the case in amplifiers with negative feedback, the amplifier gain tends to reduce the error signal to a very small value, or in other words, to bring about a situation in which the filtered transducer signal and the attenuated feedback signal are substantially equal and opposite.

The transformers 14 and 21 may be shielded in the manner shown. Each of these transformers may include a shield 46, a shield 47 and a shield 48. The shields 46, which may be termed inner floating guard shields, of each transformer 14 and 21 are connected together and to the input terminal 11. The shields 47, which may be termed transducer guard shields, are connected together and to the input terminal 24. As noted above, the input terminal 24 normally is connected to the shield of the transducer, the signal terminals of which are connected to the input terminals 10 and 11. The shield of the transducer normally is connected to a transducer local ground. The shields 48, which may be termed system central ground shields or mecca shields, are tied together and connected to ground.

The offset DAC 36 may be of the nature of that illustrated in U.S. Patent No. 3,011,132, entitled "Digitally Operable Potential divider." This patent relates to a variable potential divider which may be digitally controlled either by manual operation or by a digital selecting device. In the offset DAC 36 shown in the drawing, a plurality of impedances 50*a* through 50*n* are connected with a line 51 which is connected with the input of the modulator 20. One end of each of the impedances 50*a* through 50*n* is connected to respective moving arms of single-pole double-throw switches 53*a* through 53*n*, respectively. One fixed contact of each switch is connected to a voltage terminal 54 which in turn is connected to a precision source of positive or negative voltage (not shown). The other fixed contact of each switch is connected through the line 37 to the output terminal 19. A switch actuator 56 actuates the moving arms of the switches 53 to selectively and independently connect selective ones of the impedances 50*a* through 50*n* either to the voltage terminal 54 or ground in any desired order to provide a series-parallel arrangement of the impedances. An additional impedance 57 is connected between the line 51 and the voltage terminal 54. A capacitor 63 is connected from the line 51 to ground. This capacitor is utilized to shunt the modulator 20 switching transient currents.

By choosing the admittances of the impedances 50*a* through 50*n* in a well-known conventional manner, any integer multiple of a minimum scale increment can be selected for the potential divider. For example, sixteen impedances can be utilized having admittances which are the following integer multiples of a minimum admittance value: 8,000, 4,000, 2,000, 1,000, 800, 400, 200, 100, 80, 40, 20, 10, 8, 4, 2 and 1. The impedance 57 serves two purposes. First, it prevents the scale of the potential divider from being switched to zero and, second, it provides a control for the magnitude of the range of potential divider scale available.

An offset control lline 64 is connected with the switch actuator 56. A digital input is applied to the line 64 which causes the switch actuator 56 to operate the switches 53 selectively and independently to provide a series-parallel arrangement of the impedances 50 as noted previously. The switch actuator 56 may include relays for operating the moving arms of the switches 53, or entirely electronic circuitry including transistor switches for the switches 53 may be employed, if desired.

An offset power supply (not shown) has one terminal connected with the voltage terminal 54 and another terminal which is grounded. Depending upon the offset to be corrected, a positive or a negative potential is applied to the terminal 54. The offset to be corrected may be of any component, and may be either before or after the basic amplifier. Digital input signals, which may be supplied from a remote location, are applied to the line 64 to operate the switch actuator 56. Desired combinations of the switches 53 are operated to supply the desired voltage to the line 51. Since a positive or a negative voltage may be applied to the line 51 by the offset DAC 36, voltages may be added to or subtracted from the feedback voltage applied to the input of the modulator 20. This arrangement eliminates the need for an additional amplifier and provides the desired offset correction without affecting the output impedance or the input circuitry of the over-all amplifier.

The feedback signal applied to the modulator 20 is modulated and transferred through the transformer 21 to the demodulator 22. The modulator 20 and the demodulator 22 operate synchronously. At this time the feedback signal has been corrected for any offset voltages introduced by the transducer or by any other components. The output of the demodulator 22 is supplied to the gain DCP 41 which serves to attenuate the feedback signal by any desired amount to thereby control the gain of the over-all amplifier. The digitally controlled potentiometer 41 has compressed codings and provides a constant input impedance. The potentiometer portion of the gain DCP 41 includes a plurality of resistances selectively connectable in series with the output of the demodulator 22, and a plurality of resistances selectively connectable in parallel with the output of the demodulator 22. A plurality of resistances 70*a* through 70*n*, 71*a* through 71*n* and 73 are connected in series with the output of the demodulator 22 and the line 42. Resistances 74*a* through 74*n* are connected across the output lines 26 and 42. Switches 76*a* through 76*n* are connected with the respective resistances 70*a* through 70*n* and 74*a* through 74*n*. A first pair of fixed contacts of the switch 76*a* is connected across the resistance 70*a* and a second pair of fixed contacts of the switch 76*a* is connected across the resistance 74*a*. Contacts of the remaining switches 76*b* through 76*n* are connected in a like manner with the respective resistances 70*b* through 70*n* and the respective resistances 74*b* through 74*n*. Movable contacts of the switches 76*a* through 76*n* may be selectively and independently moved to their upper position to shunt any one or more of the resistances 70*a* through 70*n* or to their lower position to shunt any one or more of the resistances 74*a* through 74*n*. The movable contacts of the switches 76*a* through 76*n* are controlled by a switch actuator 78 which may be remotely controlled by applying a signal to an input line 79 connected thereto. The resistances 70*a* through 70*n* and 74*a* through 74*n* are fine step resistances and may provide fine control of attenuation. The resistances 70*a* and 74*a* are equal, the resistances 70*b* and 74*b* are equal, etc. These resistances may be weighted according to a decimal code, or according to a binary code, such as, an 8–4–2–1, 2, 4, 2, 1, etc. codes, or in accordance with any preassigned numerical weighting scheme (octal, biquinary, duodecimal, etc.).

Switches 80*a* through 80*n* are connected with the respective resistances 71*a* through 71*n* and respective resistances 81*a* through 81*n*. A movable arm and a first fixed contact of each of the switches 80*a* through 80*n* are connected across respective resistances 71*a* through 71*n*. A second fixed contact of each of the switches 80*a* through 80*n* is connected with the respective resistances 81*a* through 81*n* which in turn are connected with the line 26 connected from the output of the demodulator 22 to the filter 12. The switches 80*a* through 80*n* function to selectively and independently shunt one or more of the resistances 71*a* through 71*n*, or to connect any one or more of the resistances 81*a* through 81*n* across the output of the demodulator 22. The movable contacts of the switches 80*a* through 80*n* are controlled by a switch actuator 83 which may be remotely controlled by applying a signal to an input line 84 connected thereto. If desired, a single switch actuator may be employed to operate all of the switches 76 and 80. The resistances 71 and 81 provide coarse control of attenuation of the feedback signal. It should be noted that the subscripts "*a*" through "*n*" have been utilized for the resistances 70, 71, 74 and 81 to indicate tthat a few or many of these resistances may be employed, as desired.

As noted above, the resistances 70*a* and 74*a* are equal in value, the resistances 70*b* and 74*b* are equal in value, etc., and these resistances may be weighted according to any desired coding. When the movable contact of the switch 76*a* is in its up position, the resistance 70*a* is shunted and the resistance 74*a* is not shunted. When the movable contact of the switch 76*a* is moved to its lower position, the resistance 74*a* is shunted and the resistance 70*a* is not. The remaining switches 76*b* through 76*n* may be selectively and independently operated in a similar manner to provide the desired fine control of attenuation of the feedback signal. It should be noted that since the resistances 70*a* through 70*n* are equal to the respective resistances 74*a* through 74*n* and since the switches 76 shunt one of the resistances 70 when one of the corresponding resistances 74 is not shunted, or vice versa, the input impedance of that portion of the potentiometer including the resistances 70 and 74 remains constant. This input impedance remains constant as the switches 76 are operated to provide different degrees of attenuation of the feedback signal. Since the total input impedance of the portion of the potentiometer including the resistances 70 and 74 remains constant no matter which position any one of the switches 76 is in, more than one resistance may be shunted as required by binary-coded decimal codes and other types of coding. If desired, the resistances 70 and 74 may be arranged in one or more decades. The resistances 70 need not be as precise as the resistances 74. Assuming, for example, that the resistances 74 have a tolerance of ±0.005%, then the resistances 70 need be accurate only to 0.005% times the minimum gain of the potentiometer for equal error contributions.

The resistances 71 and 81 and the switches 80 provide additional control over the degree of attenuation of the feedback signal. The switches 80*a* through 80*n* are operated selectively and independently for coarse control of attenuation of the feedback signal. The inclusion of the resistances 71 and 81 and the operation of the switches 80 does not affect the input impedance of the over-all potentiometer. The reason for this will become apparent from the discussion which follows.

Where there is a chain of switchable resistances, $R_C$, and additional resistances are to be inserted to provide series-parallel attenuation in front of the chain of resistances such that the attenuation is increased by A and the input impedance remains constant, then if $$A=\frac{\text{new attenuation}}{\text{old attenuation}} \quad (1)$$

then make $$R_P=\frac{R_C}{A} \quad (2)$$

and $$R_A=R_O-R_S-R_P \quad (3)$$

where $R_A$ is the newly added series resistance, such as, the resistance 71*a*, $R_B$ is the newly added parallel resistance, such as, the resistance 81*a*, $R_C$ is the total constant resistance of that portion of the potentiometer including the resistances 70 and 74, $R_O$ is the desired constant input impedance of the potentiometer, i.e., $$R_O=R_S+R_C \quad (4)$$

$R_P$ is the total parallel resistance of the resistances $R_C$ and $R_B$, thus $$\frac{1}{R_P}=\frac{1}{R_C}+\frac{1}{R_B},\text{ and } R_P=\frac{R_C R_B}{R_C+R_B} \quad (5)$$

$R_S$ is the series resistance, such as the sum of the resistance 73 and the resistance of the modulator 20 and the demodulator 22, and A is the desired attenuation multiplication factor (and thus a gain multiplication factor when the potentiometer is used in an amplifier feedback circuit) when the resistances $R_A$ and $R_B$ are switched into the circuit.

Referring now to FIG. 2, for the over-all potentiometer without the addition of $R_A$ and $R_B$, $$\text{Original attenuation}=\frac{R_C+R_S}{NR_C} \quad (6)$$

for $N \leqq 1$ and gain $\leqq 1$, $$\text{Original attenuation} = \frac{R_O}{NR_C} \quad (7)$$

where

N is the portion of $R_C$ picked off (set by resistances 70 and 74 and switches 76), i.e., $$N = \frac{R_{CL}}{R_C}$$

Referring to FIG. 3, with $R_A$ and $R_B$ included in the circuit:

$$\text{New attenuation} = \frac{V_X}{V_O} \cdot \frac{V_i}{V_X} = \frac{V_i}{V_O} = \frac{R_S + R_A + R_P}{NR_P} \quad (8)$$

substituting for $R_P$ gives $$\text{New attenuation} = \frac{A(R_S + R_A + R_P)}{NR_C}$$

and substituting for $R_A$ gives $$\text{New attenuation} = \frac{A[R_S + R_P + (R_O - R_S - R_P)]}{NR_C}$$

$$= \frac{A(R_O)}{NR_C}$$

$$= A \cdot \frac{R_O}{NR_C} \quad (9)$$

where $$\frac{R_O}{NR_C}$$

is the original attenuation (Equation 7). Thus, the new attenuation is equal to the original attenuation multiplied by A.

Any desired number of attenuation multiplication factors A may be provided by selecting the proper values $R_A$ and $R_B$. The equations above may be solved for the resistances $R_A$ and $R_B$. Equations 2 and 4 may be substituted in Equation 3 providing, $$R_A = (R_S + R_C) - R_S - \left(\frac{R_C}{A}\right)$$

$$= R_C\left(1 - \frac{1}{A}\right) \quad (10)$$

Equation 2 may be substituted in Equation 5 providing, $$\frac{R_C}{A} = \frac{R_C R_B}{R_C + R_B}$$

which gives $$R_B = \frac{R_C}{A - 1} \quad (11)$$

Equations 10 and 11 above may be solved for different multiplication factors A to determine the values of the respective resistances 71*a* through 71*n* and 81 through 81*n*. That is, the Equations 10 and 11 may be solved by assuming a first multiplication factor $A_1$ to determine the magnitudes of the resistances 71*a* and 81*a*, then solved for a multiplication factor $A_2$ to determine the values of resistances 71*b* and 81*b*, etc. As an example, $R_C$ may be equal to 100,000 ohms and $A_1$ equal to 10. By solving the Equations 10 and 11 it may be determined that $R_A$ is equal to 90,000 ohms and $R_B$ is equal to 11,111 ohms. A second multiplication factor $A_2$ may be the same as or different from the first. For example, $A_2$ may be 100, and then $A_1$ and $A_2$ together (resistances 81*a* and 81*b* switched into the circuit) provide a factor of 1000. Any combination of the switches 80 may be operated to provide the coarse attenuation desired. When all of the resistances 81*a* through 81*n* are switched into the circuit, the maximum attenuation and, hence, the maximum forward gain of the over-all amplifier is provided. Thus, the feedback attenuation, and therefore the forward gain, established by the resistances 70 and 74 may be further varied by selectively switching the resistances 71 and 81. If additional resistances 71 and 81 are employed, obviously different gain values may be obtainable.

The variable resistance 73 is included in series with the resistances 70 and 71 as a trimming resistance. When the over-all amplifier is constructed and the DCP 41 connected thereto, the resistance 73 may be adjusted with the DCP 41 set at some gain value. All selectable gains maintain the same proportion to each other no matter what the source impedance is, when the resistance 73 is adjusted at only one gain setting. Therefore, for a given source impedance, setting one gain by the resistance 73 sets all gains.

It now should be apparent that the present invention provides an amplifier in which gain and offset may be digitally controlled. Digitally controlled potentiometer circuits are connected in the feedback circuit of the amplifier, and these potentiometer circuits may be remotely controlled by digital signals to control gain and offset. The arrangement provided by the present invention does not affect the input impedance, the output impedance or the isolation of the input of the amplifier from the output thereof. Additionally, the present invention provides a digitally controlled potentiometer with compressed coding having a constant input impedance, and provides digital control of the attenuation of a signal applied thereto.

It will be understood that although an exemplary embodiment of the present invention has been disclosed and discussed, other applications and circuit arrangements are possible and that the embodiments disclosed may be subjected to various changes, modifications, and substitutions without necessarily departing from the spirit of the invention.

What is claimed is:

1. An amplifier having an input and output, a circuit connected from the output to the input of said amplifier to supply a feedback signal from said output to said input, the improvement comprising a digital-to-analog converter having an analog voltage input and a digital input, and connected with said circuit to add to or subtract from said feedback signal, and a digitally controlled potentiometer having a digital input and being connected in said circuit to vary the attenuation of said feedback signal.

2. A voltage transfer device including first means for receiving an input signal and a feedback signal to produce an error signal and to modulate said error signal, second means connected with said first means for amplifying and demodulating said error signal, and third means connected with the output of said second means and with said first means to receive a signal from said second means and to apply a feedback signal to said first means, the improvement comprising a digitally controlled voltage source connected with said third means and responsive to a digital input to add a voltage to or subtract a voltage from the signal received by said third means from said second means, and a digitally controlled impedance means included in said third means for responding to a digital input to control the attenuation of the feedback signal applied by said third means to said first means.

3. An amplification device including first means for receiving input and feedback signals to produce error signals and to modulate the error signals, a transformer connected with said first means and with a second means to transfer the modulated error signals to said second means which amplifies and demodulates said error signals, a feedback circuit connected between said second means and said first means for receiving signals from said second means and transferring signals to said first means, the improvement comprising a digital-to-analog converter connected with said feedfeedback circuit and responsive to digital input signals for adding positive or negative voltages to the signals received by said feedback circuit from said second means, and a digitally controlled potentiometer connected in said feedback circuit and responsive to digital input signals for varying the attenuation of the signals transferred by said feedback circuit to said first means.

4. A device as in claim 3 wherein said feedback circuit includes a modulator having an input connected with said second means and an output connected with a transformer, said digital-to-analog converter is connected with the input of said modulator, a demodulator having an input connected with said transformer and an output, and said digitally controlled potentiometer is connected with the output of said demodulator and with the first means.

5. A device as in claim 4 wherein said digitally controlled potentiometer includes a first plurality of resistance means, a second plurality of resistance means equal in number to said first plurality of resistance means, a first plurality of switch means equal in number to said first plurality of resistance means, and means interconnecting said first and second pluralities of resistance means and said plurality of first switch means whereby each one of said first switch means means may be operated selectively and independently to shunt a respective one of said first plurality of resistance means or to conductively connect a respective one of said second plurality of resistance means with a respective one of said first plurality of resistance means, a third plurality of resistance means, a fourth plurality of resistance means equal in number and respective resistance value to the resistance means in said third plurality of resistance means, a second plurality of switch means, equal in number to said third plurality of resistance means, means interconnecting said third and fourth pluralities of resistance means and said second plurality of switch means whereby each one of said switch means in said second plurality of switch means may be selectively and independently operated to shunt either a respective one of said third plurality of resistance means or a respective one of said fourth plurality of resistance means.

6. A potentiometer circuit comprising first and second input terminals for receiving input signals and first and second output terminals for supplying output signals to a utilization device, the improvement comprising one through $n$ first resistances, and one through $n$ second resistances, where $n$ is any integar, one through $n'$ third resistances, and one through $n'$ fourth resistances, where $n'$ is any integer, means interconnecting said first and third resistances in series between the first of said input and output terminals, means connecting the second input terminal with said second output terminal, one through $n$ first switch means, means connecting each of said second resistances with respective ones of said first switch means, means connecting each of said first switch means with respective ones of said first resistances whereby each one of said first switch means may be selectively and independently operated to shunt each respective one of said first resistances or to connect each one of the respective second resistances with each one of the respective first resistances, means connecting said fourth resistances across said first and second output terminals, one through $n'$ second switch means, and means interconnecting said third and fourth resistances and said second switch means whereby each of said second switch means may be selectively and independently operated to either shunt a respective one of said third resistances or shunt a respective one of said fourth resistances.

7. A potentiometer circuit as in claim 6 including means connected with each of said second switch means for receiving digital input signals.

8. A potentiometer circuit as in claim 7 wherein said third and fourth resistances are weighted according to a code.

References Cited by the Examiner

UNITED STATES PATENTS 3,027,079 3/1962 Fletcher et al. -------- 340—347

MALCOLM A. MORRISON, *Primary Examiner.*